United States Patent [19]

Weidler

[11] 4,449,767

[45] May 22, 1984

[54] CONNECTOR ASSEMBLY HAVING IMPROVED KEYING AND LATCHING SYSTEM

[75] Inventor: Charles H. Weidler, Lancaster, Pa.

[73] Assignee: AMP Incorporated, Harrisburgh, Pa.

[21] Appl. No.: 412,685

[22] Filed: Aug. 30, 1982

[51] Int. Cl.³ .................... H05K 1/00; H01R 13/62

[52] U.S. Cl. .................... 339/17 LC; 339/91 R; 339/113 R; 339/186 M

[58] Field of Search ............ 339/91 R, 184 R, 184 M, 339/17 LC, 113 R, 186 R, 186 M

[56] References Cited

U.S. PATENT DOCUMENTS

| | | | |
|---|---|---|---|
| 3,112,974 | 12/1963 | Curtis et al. | 339/186 M X |
| 3,366,729 | 1/1968 | Pauza | 174/138 |
| 3,399,374 | 8/1968 | Pauza et al. | 339/91 |
| 3,562,696 | 2/1971 | Barnhart et al. | 339/60 |
| 3,569,909 | 3/1971 | Garver | 339/91 |
| 3,588,784 | 6/1971 | Kunkle et al. | 339/65 |
| 4,008,941 | 2/1977 | Smith | 339/17 LC X |
| 4,169,648 | 10/1979 | Moist, Jr. | 339/103 R |
| 4,192,568 | 3/1968 | Marks et al. | 339/91 R |
| 4,376,565 | 3/1983 | Bird et al. | 339/186 M |
| 4,379,606 | 4/1983 | Clark et al. | 339/91 R X |
| 4,405,193 | 9/1983 | Weidler | 339/99 R |
| 4,408,824 | 10/1983 | Weidler | 339/258 R |

FOREIGN PATENT DOCUMENTS

| | | | |
|---|---|---|---|
| 2021547 | 11/1971 | Fed. Rep. of Germany | 339/186 M |

*Primary Examiner*—John McQuade

*Assistant Examiner*—Steven C. Bishop

*Attorney, Agent, or Firm*—F. W. Raring

[57] ABSTRACT

An electrical connector assembly comprises receptacle housing and plug housing. The receptacle housing has a latch arm hinged to one sidewall thereof. The latch arm extends forwardly beyond the mating face of the receptacle. Keyways are provided on the sidewall beneath the latch arm and are covered by the latch arm. Inspection slots are provided in the latch arm in alignment with the keyways. The plug part has removable keys integral therewith which are received in the keyways. The parts can be keyed to each other by removing one of the keys from the plug and placing a key plug in the corresponding keyway. The latching and keying features occupy a minimum amount of space on the connector housings.

10 Claims, 4 Drawing Figures

CONNECTOR ASSEMBLY HAVING IMPROVED KEYING AND LATCHING SYSTEM

FIELD OF THE INVENTION

This invention relates to electrical connector assemblies of the type comprising a plug and receptacle, the assembly having a keying system and latching means for latching the plug and receptacle to each other. The invention is particularly concerned with the provision of keying and latching systems on a connector on a limited portion of the connector housings.

BACKGROUND OF THE INVENTION

It is common practice to provide on connector plugs and receptacles latching means for latching the two parts of the connector assembly to each other so that they will not be accidentally disengaged when they are in a mated condition. It is also common practice to provide keying systems for connector assemblies comprising a key or keys on one of the housings and keyways on the other. Two connector parts can be uniquely keyed by removing one of several keys from the one connector part and placing a plug in the corresponding keyway in the other connector part.

The latching systems which are in common use in presently known connectors are usually such that it is impractical if not impossible to provide a keying system on the connector parts immediately adjacent to the latching system, particularly if the overall dimensions of the parts of the connector assembly must be maintained within strict limits. Undeer some circumstances, connector assemblies must be provided with housings designed such that two connector assemblies can be placed substantially against each other in a panel opening or on a circuit board. If the endwalls of the adjacent connector parts of two adjacent connector assemblies are against each other, it is of course impractical to provide latch arms on the endwalls of the housings. If one of the housings of each connector assembly is mounted on a circuit board, then one of the sidewalls of that housing will be against the circuit board and it is, of course, impossible to provide latch arms on the sidewall which is against the circuit board. Under such circumstances only one sidewall remains to support a latch arm. It is not practical to provide previously known types of keying systems on a connector as described above having a latch arm on its only exposed sidewall. The present invention is directed to the achievement of a connector assembly having a compact and effective keying and latching system provided on only one of the sidewalls of each housing of the connector assembly. The invention is further directed to the achievement of a connector assembly having keying and latching systems and which is of minimal overall outside dimensions.

An electrical connector assembly in accordance with the invention comprises first and second connector housings, each of the housings having a mating face, a rearward face, oppositely facing sidewalls and oppositely facing endwalls. Terminals are provided in the housings which are coupled to each other when the housings are mated with each other. At least one latch arm is provide on the first housing, the latch arm having a leading end and actuating end and being hinged to one of the external housing walls intermediate its ends. The actuating end is proximate to the rearward face of the housing and the latching end is proximate to the mating face. The second housing has latching shoulder means thereon on one of the external walls thereof for cooperation with the latching end of the latch arm. The assembly has a keying system on the housings for keying the housings to each other. The connector assembly is particularly characterized in that the keying system comprises a plurality of parallel keyways in the first housing and a like plurality of removable keys on the second housing, the keyways being in the one housing wall and extending inwardly from the mating face of the first housing. The latch arm extends over, and is in covering relationship to, the keyways. The latch arm has inspection slots therein which are in alignment with the keyways. The keys are on the one external wall of the second housing which corresponds to the one external wall of the first housing. The keys are in alignment with, and dimensioned to be received in the keyways whereby the first and second housings can be distinctly keyed to each other by removing one of the keys from the second housing and placing a key plug in the corresponding keyway in the first housing. The location of the key plug can be determined from the inspection slots so that the first and second housings can be recognized as associated housings.

In accordance with further embodiments, the one external wall of the first housing is one of the housing sidewalls and the oppositely facing endwalls of the first and second housings are parallel and extend normally of the sidewalls. The first connector housing is a receptacle housing and the second connector housing is a plug housing, the plug housing having forward portions extending from the mating face thereof along the external walls and these forward portions are received in the receptacle recess when the housings are mated. The latch arm extends from the receptacle housing beyond the mating face thereof.

In accordance with further embodiments, the keyways comprise open slots which open into the receptacle key recess and the keys are dimensioned to fill the slots when the housings are in a mated condition.

Figure 1:
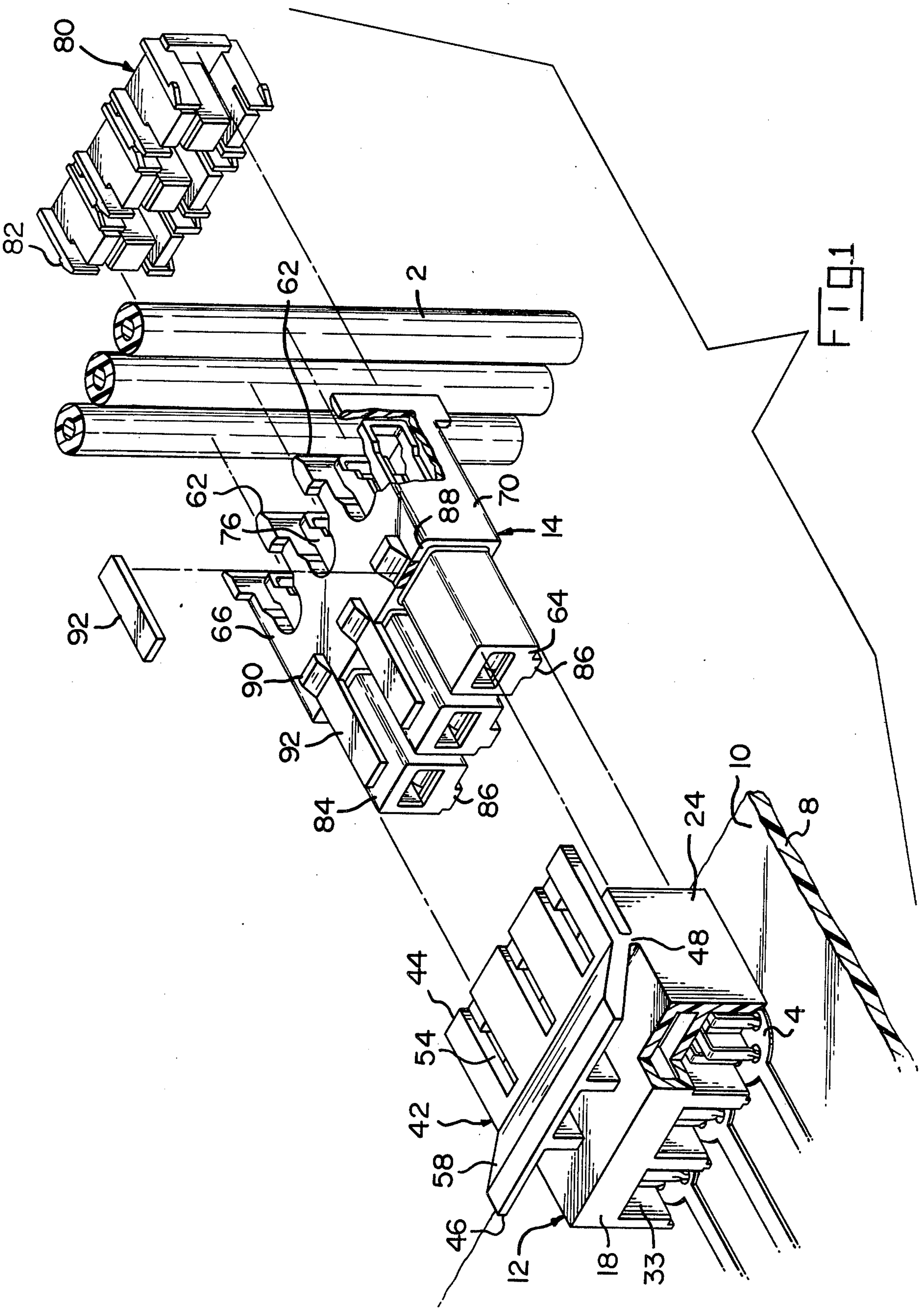
FIG. 1 is a perspective view showing a connector assembly in accordance of the invention with wires and a back cover member exploded from the plug housing.

The disclosed embodiment of the invention serves to connect insulated wires 2 to conductors 4 on the upper surface 10 of a circuit board 8 having a downwardly facing lower surface 6. The connector assembly comprises a first housing 12, a receptacle in this embodiment, and a second housing 14 which is a plug dimensioned to be received in the receptacle.

The receptacle housing 12 is a one piece molded plastic part having the mating face 16 and a rearward face 18, these faces being oppositely directed with respect to each other. The housing has upper and lower external sidewalls 20, 22 and oppositely facing endwalls 24 which extend normally of the sidewalls so that identical receptacles can be placed against each other as required.

Recesses or cavities 26 extend into the mating face 16 and have inner ends 30. Tab-type terminals 28 are provided in these receptacles and extend through the inner end 30 of the cavity and into openings 33 that extend inwardly from the rearward face 18. Each tab terminal 28 has three mounting posts 32 extending therefrom which extend through openings 36 in the circuit board 8. The openings are lined with plated metal as shown so that the mounting post portions are thereby connected to the conductors 4 on the upper surface of the circuit board. In the disclosed embodiment, the mounting posts have compliant portions 34 which establish contact with the conductors in the circuit board openings 36. Alternatively, the conductors 4 can be provided on the underside 6 of the circuit board, these posts can be soldered to the conductors.

It is preferable to provide three mounting posts 32 for each terminal tab 28 in the embodiment shown for the reason that the connector is intended to carry a fairly high amperage and the three mounting posts which are commonly connected to the conductor 4 by way of the openings 36, are capable of carrying a relatively high current. At the same time, they are mechanically stronger than a single mounting post would by having a cross section three times that of the individual posts.

If desired, a mounting boss 38 can be provided on the lower sidewall 22 which is received in an opening in the circuit board and which serves mechanically to secure the first housing 2 to the circuit board.

A plurality of keyways or keying slots 40 are provided in the upper sidewall 20 and extend inwardly from the mating face 16. Three keyways are provided in the disclosed embodiment, each keyway being centrally located over one of the recesses 26. These keyways receive removable keys 92 on the plug housing as will be described below.

Figure 2:
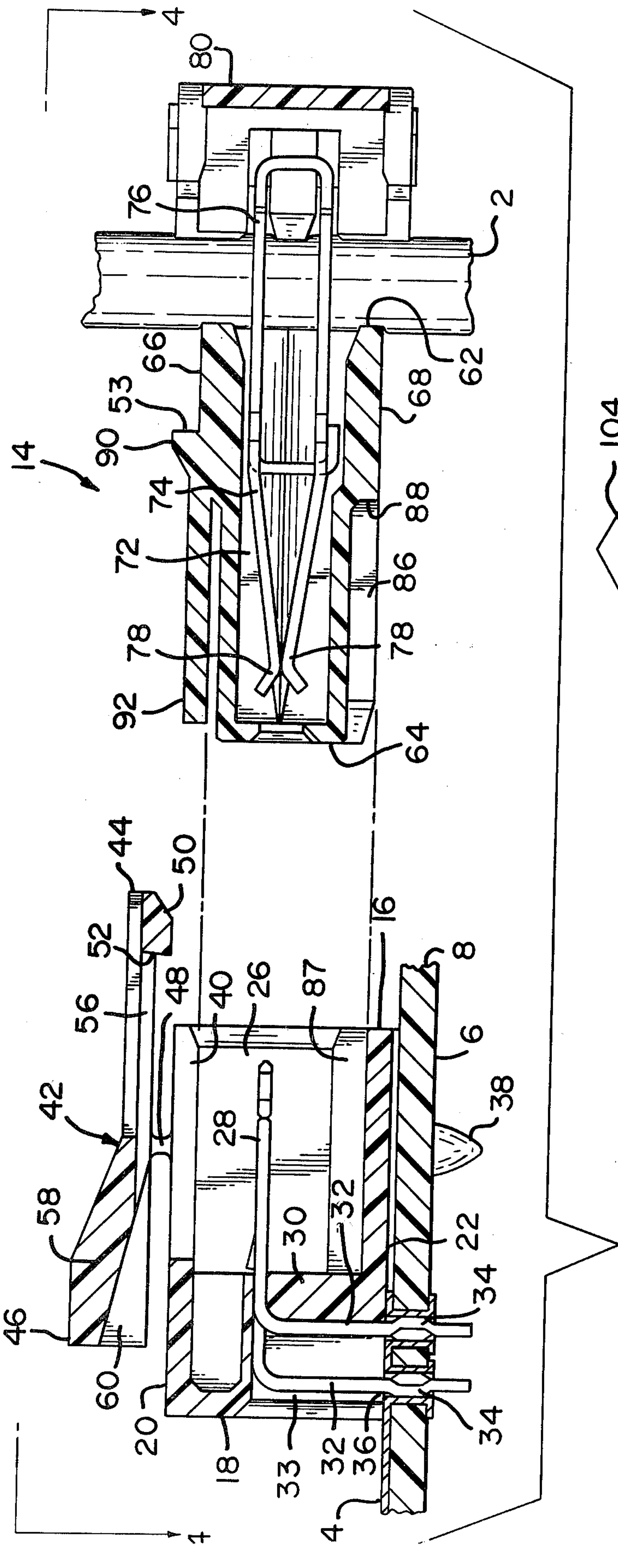
FIG. 2 is a sectional side view of the embodiment of FIG. 1 with the plug disposed in alignment with the receptacle.
Figure 4:
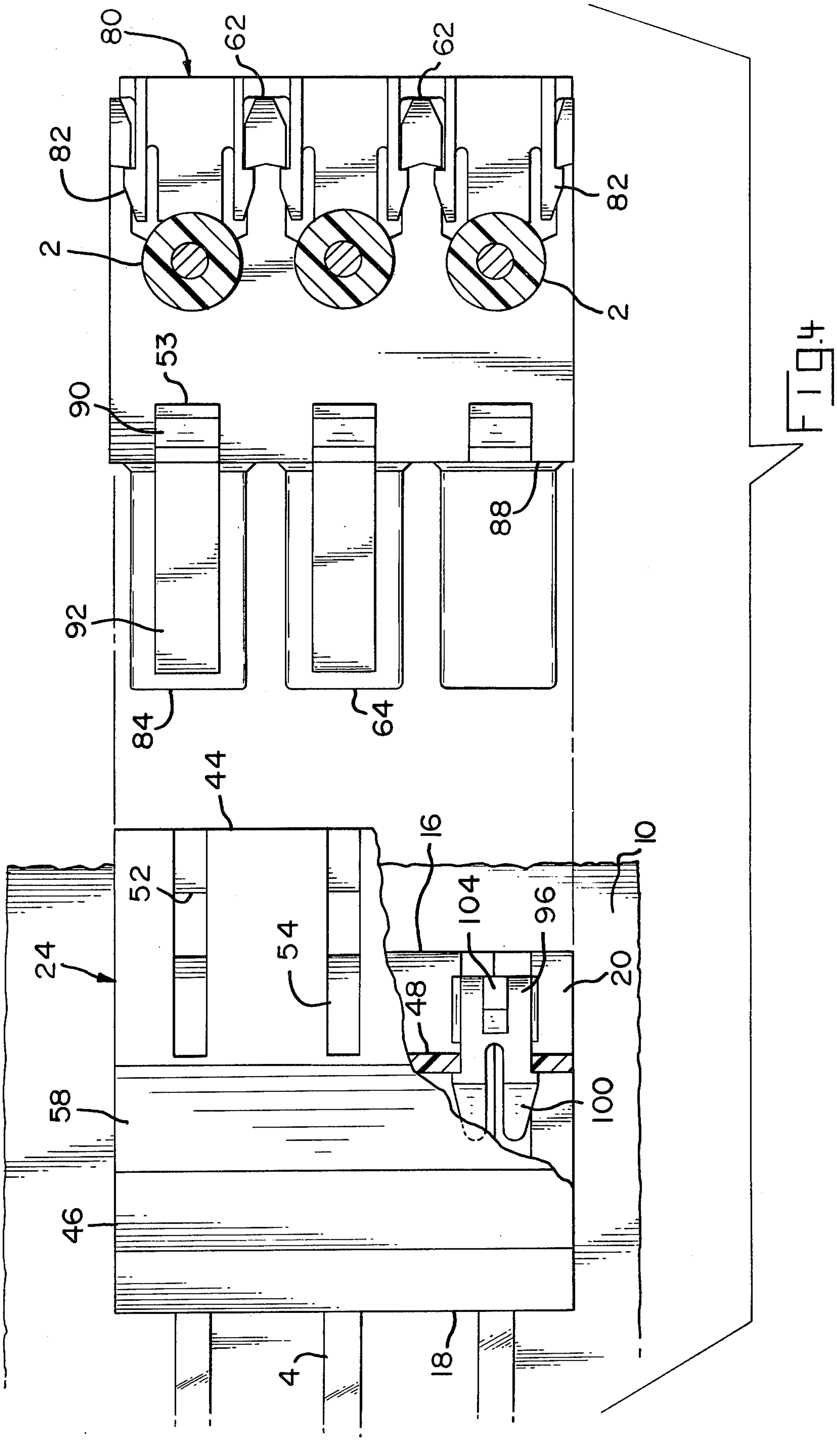
FIG. 4 is a view looking in the direction of the arrows 4—4 of FIG. 2.

A latch arm 42 is provided on the upper sidewall 20 and extends across the sidewall for the full width of the housing as shown in FIG. 4. The latch arm has a latching end 44 which is located beyond the plane of the mating face 16 and an actuating end 46 which is above the sidewall 20 and proximate to the rearward face 18. The latch arm is hinged to the sidewall 20 by integral hinges 48 which are located between adjacent keyways 40 and adjacent to the endwalls 24 as shown in FIG. 4. The underside of the latching end 44 has a boss 50 thereon having a rearwardly or leftwardly facing shoulder 52 as viewed in FIG. 2. This shoulder cooperates with shoulders 53 on the plug part when the two housings are engaged with each other. The latch arm has inspection slots 54 therein which are in alignment with, and centrally located over, the keyways 40 as viewed in FIG. 4. The underside 56 of the latch arm may be of reduced thickness on each side of the inspection slots in the interest of good molding practice.

The portion of the latch arm which extends from the hinge 48 to the actuating end 46 is of increased thickness as shown at 58 and is inclined upwardly and away from the sidewall 20. The underside of this portion of the latch arm is provided with ribs 60 which act as stops when the latch arm is pushed downwardly thereby to raise the latching end 44 when the parts are coupled or de-coupled.

The plug housing 14 is also of molded insulating material having a mating face 64, a rearward face 62, upper and lower sidewalls as viewed in the drawing 66, 68 and oppositely facing endwalls 70. Side-by-side terminal receiving cavities 72 extend through the housing and between the faces and each cavity contains a terminal 74. The terminals have wire connecting portions 76 at the rearward or right hand ends as viewed in FIG. 2 and have convergent spring arms 78 at the forward ends adjacent to the mating face 16. The spring arms receive the blade portion 28 of the terminal in the associated recess 26 when the parts are mated. The terminals are connected to the wires by pushing the wires into wire-receiving slots at the ends 76 of the terminal. The disclosed embodiment has a closure member 80 having latching means 82 for latching it to the housing adjacent to the rearward face. To connect the wires 2 to the terminals, the wires are aligned with the slots and the back closure is assembled to the housing. The closure pushes the wires into the terminals as described more fully in application Ser. No. 271,468, now U.S. Pat. No. 4,408,824. Details of the closure member 80 are also described in application Ser. No. 271,491, now U.S. Pat. No. 4,405,193.

The forward portions 84 of the plug housing have individual projecting housing sections which are dimensioned to enter the individual receptacles in the receptacle housing 12. Advantageously, ribs 86 are provided on the lower surfaces of these projections. The ribs 86 are received in rib-receiving recesses 87 in the receptacle housing and which are provided in the lower surfaces, as viewed in FIG. 2, of the recesses 26. The ribs 86 and rib-receiving recesses are one part of the keying system for the connector assembly, the other part of the keying system being the keys 92 and keyways 40.

The ribs 86 and recesses 87 ensure that when two or more connector assemblies are stacked against each other, with the endwalls 24 against each other, it will be impossible to insert the three housing sections 84 of a plug into two of the recesses 26 of one receptacle and one of the recesses 26 of an adjacent connector. The keys 92 and keyways will not necessarily preclude the possibility of this type of mis-mating. The ribs 86 and recesses 87 will preclude such mis-mating because of the fact that the ribs are offset from the center lines of the housing sections 84 as shown.

Plug housing 14 has a forwardly facing shoulder 88 at the inner ends of the sections 84 and the bosses 90 on the sidewall 66 which form the previously identified shoulders 53 are provided on the sidewall adjacent to this shoulder. The bosses 90 are in alignment with removable keys 92 that extend from a shoulder 88 towards the mating face 64. The keys are dimensioned to be received in the key slots or keyways 40 when the parts are coupled to each other as is apparent from FIG. 2.

Figure 3:
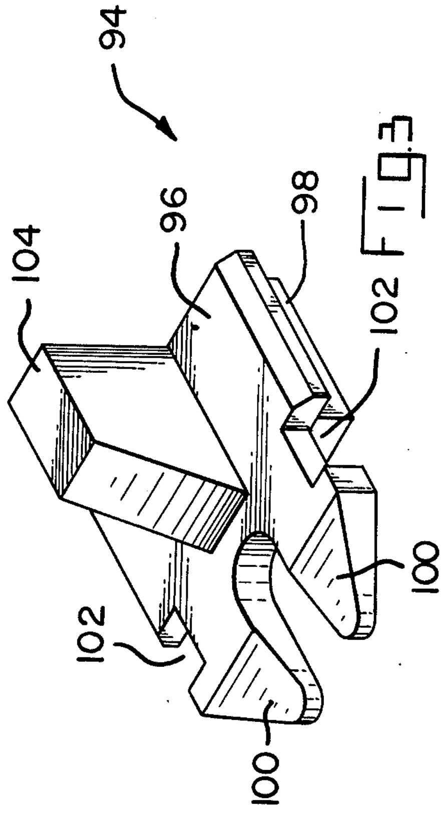
FIG. 3 is a perspective view of a key plug used in the practice of the invention.

In order to key a particular plug housing 14 to a receptacle housing 12, one of the keys 92 is removed from the plug housing and a key plug 94 is placed in the corresponding key slot in the receptacle housing. The key plug 94, FIG. 3, has an underside 98 which is dimensioned to be received in the keyway and an upper portion 96 which extends beyond the side edges of the keyway. At its left-hand end as viewed in FIG. 3, the key plug has a pair of side-by-side flexible ears 100 which are convergently tapered. The key plug can be assembled to a keyhole in the housing 12 by placing the plug in the keyway and pushing the plug towards the inner end of the keyway and past an adjacent pair of the hinges 48. During movement, the ears 100 will be flexed inwardly until they pass the hinges and the hinges are received in notches 102 provided in the side edges of the key plug. The key plug has an indicator ear 104 which is dimensioned to be received in the associated inspection slot 54 to indicate the presence of a key plug in that particular keyway. Where a plurality of connector assemblies are mounted adjacent to each other, the associated plug and receptacles can be identified by merely observing which key has been removed from the plug housing and observing which receptacle housing has a key plug in the corresponding keyway. Advantageously, the key plugs are of a color which contrast with that of the housing.

As explained previously, the keying system and the latching system of the disclosed embodiment are both provided on one sidewall of each of the two housings of the assembly and the endwalls 24, 70 of the housings are such that identical housings can be stacked against each other. The overall width of the housings is also limited and a connector assembly in accordance of the invention can thereby be provided in restricted areas where required.

The connector housings of the disclosed embodiment can be molded in a "straight draw" mold assembly, that is, a mold assembly having core pins which extend only in the direction of movement of the mold parts when they are opened and closed. The mold assembly does not require core pins which extend normally of the direction of movement, a type of mold which is more complicated, and therefore more costly, than a straight draw mold. The features of the housings which permit the use of a straight draw mold will be apparent from an inspection of the drawing; for example, the location of the shoulders 52 in alignment with the inspection slots 54 and the reduced thickness section 56 of the latch arm permit the use of overlapping core pins to form these parts.

I claim:

1. An electrical connector assembly of the type comprising first and second connector housings, each of the housings having a mating face and a rearward face which faces oppositely with respect to the mating face, external housing walls extending from the mating face to the rearward face, the external walls comprising oppositely facing sidewalls and oppositely facing endwalls, terminals in the housings which are coupled to each other when the housings are mated with each other, at least one latch arm on the first housing, the latch arm having a latching end and an actuating end and being hinged to one of the external housing walls intermediate its ends, the actuating end being proximate to the rearward face and the latching end being proximate to the mating face, the second housing having latching shoulder means thereon on one of the external walls thereof for cooperation with the latching end to latch the housings to each other when they are in a mated condition, the actuating end being movable towards the plane of the one external wall with concomitant movement of the latching end away from the plane of the one external wall thereby to unlatch the housings, and a keying system on the housings for keying the housings to each other, the connector assembly being characterized in that:

the keying system comprises a plurality of parallel keyways in the first housing and a like plurality of removable keys on the second housing, the keyways being in the one external housing wall and extending inwardly from the mating face of the first housing, the latch arm extending over, and in covering relationship to, the keyways, the latch arm having inspection slots therein which are in alignment with the keyways to permit inspection of the keyways, the keys being on the one external wall of the second housing which corresponds to the one external wall of the first housing, the keys being in alignment with, and being dimensioned to be received in, the keyways whereby, the first and second housings can be distinctly keyed to each other by removing one of the keys from the second housing and placing a key plug in the corresponding keyway in the first housing, and the location of the key plug can be determined from the inspection slots so that the first and second housings can be recognized as associated housings.

2. An electrical connector assembly as set forth in claim 1, characterized in that the one external wall of the first housing and the one external wall of the other housing are sidewalls, the oppositely facing endwalls of the first and second housings being parallel to, and extending normally of, the sidewalls.

3. An electrical connector assembly as set forth in claim 2 characterized in that the first connector housing is a receptacle housing having at least one receptacle recess extending inwardly from the mating face thereof, the second connector housing being a plug housing, the plug housing having forward portions extending from the mating face thereof along the external walls which are received in the receptacle recess when the housings are mated, the latch arm extending from the receptacle housing beyond the mating face thereof.

4. An electrical connector assembly as set forth in claim 3 characterized in that each of the housings is a one piece molded part.

5. An electrical connector assembly as set forth in either of claims 3 or 4 characterized in that the keyways in the receptacle housing comprise open slots in the one housing sidewall which open into the receptacle recess, the keys being dimensioned to fill the slots when the housings are in a mated condition.

6. An electrical connector assembly as set forth in claim 5 characterized in that one of the keys is removed from the plug part and a keyplug is positioned in the keyslot which is opposed to the position of the removed key, the keyplug having a boss thereon which extends into the associated inspection slot.

7. An electrical connector assembly as set forth in claim 6 characterized in that latching end of the latch arm extends for substantially the full width of the first housing as measured between the endwalls of the first housing, the latching end having a plurality of spaced-apart latching shoulders thereon which are opposed to the mating face of the first housing, the shoulders each being in alignment with one of the keyslots, the latch arm being hinged to the one housing sidewall of the first housing by at least two hinges which are integral with the one housing sidewall, the hinges being between adjacent keyways.

8. An electrical connector assembly as set forth in claim 7 characterized in that the key plug has locking ears extending from the side edge portions thereof, the locking ears being interengaged with adjacent hinges thereby to retain the key plug in the keyslot.

9. An electrical connector assembly as set forth in claim 8 characterized in that the receptacle housing is mounted on a circuit board.

10. An electrical connector assembly as set forth in claim 3 characterized in that the receptacle housing has a plurality of side-by-side receptacle recesses therein, the forward portions of the plug housing comprising side-by-side spaced apart housing sections, each of the housing sections being dimensioned to be received in one of the recesses, the keying system further comprising at least one keying rib integrally molded on the plug housing and at least one rib-receiving recess in the receptacle housing, the keying rib and the rib-receiving recess each extending from the mating face of its respective housing towards the rearward face thereof, the rib and rib-receiving recess being effective to prevent insertion of the plug part into the receptacle recesses of two receptacle parts which are stacked against each other in side-by-side relationship.

* * * * *